United States Patent
Kelly et al.

(10) Patent No.: US 10,481,179 B2
(45) Date of Patent: Nov. 19, 2019

(54) AUTOMATIC FREQUENCY PRESCALER

(71) Applicant: Tektronix, Inc., Beaverton, OR (US)

(72) Inventors: David L. Kelly, Portland, OR (US); Patrick A. Smith, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 452 days.

(21) Appl. No.: 15/172,541

(22) Filed: Jun. 3, 2016

(65) Prior Publication Data

US 2017/0003321 A1  Jan. 5, 2017

Related U.S. Application Data

(60) Provisional application No. 62/187,117, filed on Jun. 30, 2015.

(51) Int. Cl.
| | |
|---|---|
| *G01R 23/02* | (2006.01) |
| *G01R 13/32* | (2006.01) |
| *G01R 13/02* | (2006.01) |

(52) U.S. Cl.
CPC ......... *G01R 13/32* (2013.01); *G01R 13/0254* (2013.01); *G01R 13/0272* (2013.01); *G01R 23/02* (2013.01)

(58) Field of Classification Search
CPC .............. G01R 13/0254; G01R 29/02; G01R 31/31709; G01R 13/0272; H03B 19/00; H03B 19/12; H03B 23/00
See application file for complete search history.

(56) References Cited

U.S. PATENT DOCUMENTS

| | | | | |
|---|---|---|---|---|
| 4,580,281 A | * | 4/1986 | Carlton | H03K 21/38 377/10 |
| 4,791,404 A | * | 12/1988 | Hollister | G01R 13/34 324/102 |
| 4,799,165 A | * | 1/1989 | Hollister | G01R 13/34 324/76.15 |
| 5,321,350 A | * | 6/1994 | Haas | G01R 23/02 324/76.11 |
| 5,663,933 A | * | 9/1997 | Eitrich | F02D 41/009 123/487 |

(Continued)

OTHER PUBLICATIONS

Extended European Search Report for European Patent Application No. 16177129.0, dated Nov. 2, 2016.

(Continued)

*Primary Examiner* — Alesa Allgood
(74) *Attorney, Agent, or Firm* — Miller Nash Graham & Dunn; Andrew J. Harrington

(57) ABSTRACT

A test and measurement instrument including an input port configured to receive an input signal. One or more divider circuits, coupled to the input port, employ a plurality of divide ratios such that each divide ratio scales an event signal indicating events in the input signal by a predetermined integer value. A control system is also included. The control system is configured to iteratively determine an estimated signal frequency of the event signal, and automatically select a divide ratio for the event signal based on the estimated signal frequency. The instrument may also include one or more counters to count triggers in the event signal subsequent to application of the divide ratio. The instrument may also employ frequency hysteresis to prevent chatter in divide ratio selection.

13 Claims, 7 Drawing Sheets

(56) References Cited

U.S. PATENT DOCUMENTS

| | | | |
|---|---|---|---|
| 5,914,592 A | 6/1999 | Saito | |
| 5,959,479 A | 9/1999 | Woodward | |
| 6,873,670 B1 | 3/2005 | Chiu | |
| 2007/0085935 A1* | 4/2007 | Furukawa | G01R 13/0254 |
| | | | 348/735 |
| 2011/0032012 A1* | 2/2011 | Kumagai | H03L 7/087 |
| | | | 327/156 |
| 2014/0086378 A1* | 3/2014 | Felten | H03K 21/38 |
| | | | 377/44 |

OTHER PUBLICATIONS

Schneider et al, "Technical Feature Frequency Dividers", Microwave Journal, vol. 13, issue 7, pp. 53-54, 56, 58, 60, Jul. 1970.

* cited by examiner

AUTOMATIC FREQUENCY PRESCALER

CROSS-REFERENCES TO RELATED APPLICATIONS

The present application claims priority to U.S. Provisional Patent Application Ser. No. 62/187,117, filed Jun. 30, 2015 by David L. Kelly et al., and entitled "Automatic Frequency Prescaler," which is incorporated herein by reference as if reproduced in its entirety.

FIELD OF THE INVENTION

This disclosure is directed to a system and methods for oscilloscope operation, and, more particularly, to a system and methods for automatically prescaling an event signal into a frequency range for measurement by an oscilloscope.

BACKGROUND

A frequency counter is an electronic test instrument that counts pulses in an electronic signal to determine frequency. Traditional frequency counters have multiple hardware circuits for analyzing a broad range of input signals of varying frequencies. For example, frequency counter hardware is capable of analyzing and displaying low frequency signals with little pre-conditioning. Accordingly, a low frequency input port can receive and display low frequency signals without needing preconditioning circuits. A high frequency input port can receive and display higher frequency input signals by routing an input signal through preconditioning circuits to reduce the frequency of the signal to a frequency range the hardware is capable of measuring.

But there are shortcomings with the conventional systems. For example, a traditional frequency counter requires the user to manually transfer the input signal between the ports when the frequency drops into the lower band from the higher band or vice versa. Such a manual transfer is impractical for high speed complex signals that rapidly change frequencies. Further, the traditional frequency counter employs a single conditioning circuit locked to a maximum conditioning value to accommodate the highest frequency signal allowed for the device. As a result, input signals on the low frequency end of the high frequency band are over adjusted resulting in increased jitter. Further, the conditioning circuits are typically high frequency coupled and are not amenable to trigger level based conditioning.

Embodiments of the invention address these and other issues in the prior art.

SUMMARY OF THE DISCLOSURE

Embodiments of the disclosed subject matter include an oscilloscope configured to act as a frequency counter while employing a single input port for the full range of frequency bands, which eliminates the need for manual transfer. The oscilloscope employs multiple circuit dividers, each with a predefined divide ratio. The oscilloscope iteratively tests an event signal indicating occurrences of A/B events in the input signal, to determine an estimated event signal frequency and then employs the signal frequency to select an optimal divide ratio for the signal. By selecting the optimal divide ratio, the signal does not have to traverse additional circuitry associated with higher divide ratios, resulting in reduced jitter. The oscilloscope continuously retests the signal and swaps the signal to the optimal divide circuit/ divide ratio as the signal changes. To further reduce jitter, the oscilloscope may employ a frequency hysteresis process requiring the event signal to exceed/drop below a threshold by a predetermined margin before a new divide circuit/ divide ratio selected to further reduce jitter. The oscilloscope may also determine an optimal number of displayed trigger events for a received signal, which guarantees a predetermined display refresh rate (e.g. three times a second) and reduces visual lag on the oscilloscope screen Accordingly, in at least some embodiments a test and measurement instrument comprises an input port configured to receive an input signal and one or more divider circuits employing a plurality of divide ratios such that each divide ratio scales an event signal indicating events in the input signal by a predetermined integer value. The instrument also comprises a control system configured to iteratively determine an estimated signal frequency of the event signal, and automatically select a divide ratio for the event signal based on the estimated signal frequency.

In another aspect, in at least some embodiments a method is implemented in a test and measurement instrument. The method comprises receiving an input signal via an input, and iteratively determining an estimated signal frequency of an event signal indicating events in the input signal. A divide ratio is then automatically selected to correspond to a divider circuit, for the event signal based on the estimated signal frequency. The selected divide ratio scales the event signal by a predetermined integer value for signal processing by the test and measurement instrument.

In yet another aspect, in at least some embodiments a non-transitory computer readable medium having stored thereon a computer program product for execution by a processor is configured to perform test and measurement. The computer program causes the processor to perform a method comprising receiving an input signal via an input, and iteratively determining an estimated signal frequency of an event signal indicating events in the input signal. The processor then automatically selects a divide ratio, corresponding to a divider circuit, for the event signal based on the estimated signal frequency. The selected divide ratio scales the event signal by a predetermined integer value for signal processing by the test and measurement instrument.

DETAILED DESCRIPTION

Figure 1:
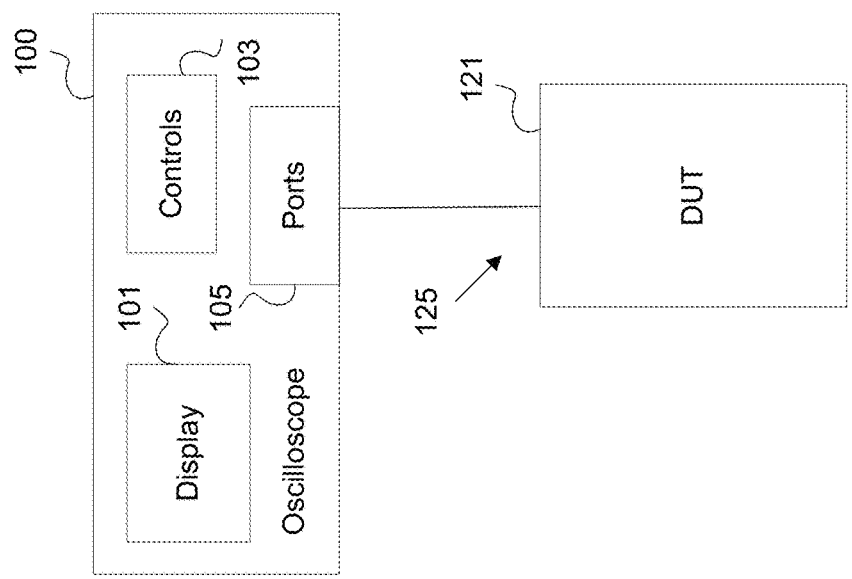
FIG. 1 is a block diagram of an embodiment of an oscilloscope configured to accept a plurality of input signals.

As described herein, the embodiments of the disclosure are directed to a test and measurement instrument (e.g. an oscilloscope) comprising a plurality of divider circuits each with a predefined divide ratio (e.g. 1, 2, 4, 8, 16, 32, 64, 128, 256, etc.) For example, each frequency divider circuit, sometimes referred to as a prescaler, is configured to divide an incoming signal frequency by two from the frequency of the previous frequency divider circuit. A maximum division may require traversing the entire set of frequency divider circuits resulting in the greatest possible frequency division and the lowest resolution signal. A controller system (e.g. hardware or software on hardware) iteratively tests an event signal to determine the frequency of the signal. Based on the determined frequency, the controller system selects an optimal divide ratio for the signal. An optimal divide ratio is the minimum amount of frequency division a signal can receive, while still reducing frequency enough to allow the local sampling hardware to count all signal edges. In other words, the control system selects a path through the divider circuits to obtain the optimal divide ratio based on the determined frequency of the signal. This allows an input signal to be accepted from a single input and sampled by the hardware at the highest resolution possible regardless of the frequency of the event signal and/or the frequency of the corresponding events. The control system may also select an optimum display trigger event count for a determined frequency to allow the display to be updated in real time. The controller system continuously monitors the event signal and selects new divide ratios as the frequency changes. The controller system may employ a frequency hysteresis process that includes a predefined margin (e.g. 25 megahertz (MHz)) so that the signal frequency must exceed or drop below a divide ratio boundary by the margin value before a new divide ratio is selected. This reduces chatter at frequencies near divider boundaries. A low resolution counter may also be employed to support the control system in determination of sudden rapid changes in frequency.

By employing the abovementioned embodiments, a test and measurement instrument can continuously display a full range of frequencies on a signal without requiring the user to switch ports, which may be difficult or impossible to accomplish for fast moving complex signals. Further, the embodiments maintain an optimal divide ratio for the signal while preventing chatter. As such, by employing the abovementioned embodiments, a resulting oscilloscope offers increased functionality and reduced requirements on the end user.

The term chatter as used in this application means rapid switching back and forth between sampling circuitry due signal properties classified near a threshold or boundary.

The term divide ratio as used in this application means an integer value associated with a divider circuit that is applied as a divisor to a signal frequency resulting in a lower frequency signal output from the divide circuit.

The term optimal divide ratio as used in this application means the minimum amount of frequency division a signal can receive, while still reducing the signal frequency enough to allow the local sampling hardware to guarantee counting of all signal edges.

The term A trigger event as used in this application means an initial trigger event, for example specified frequency rates/windows, glitches, runt pulses, etc., that initiates capture of a signal.

The term B event as used in this application means one or a number (N) of specified trigger events, for example specified frequency rates/windows, glitches, runt pulses, etc., that specifies a relative temporal position or an end to a signal capture initiated by an A trigger event.

The term frequency hysteresis as used in this application means a margin of frequency both above and below the signal frequency at which the divider would nominally be switched, requiring the signal frequency to traverse the entire margin before switching to a new divider ratio.

The term convergence estimate as used in this application means a predetermined value indicating an estimated maximum number of iterations needed to converge at a solution.

The term optimum display trigger event count as used in this application means a number of trigger events to be measured and displayed to provide both high signal resolution on the display and a fast display refresh rate (e.g. three measurements per second) to provide rapid visual feedback to a user.

The term optimum event signal as used in this application means a signal indicating the occurrence of triggered events in a corresponding input signal.

The term prescaler as used in this application means a circuit employed to reduce a high frequency signal to a lower frequency signal by integer division.

FIG. 1 is a block diagram of an embodiment of an oscilloscope 100 configured to accept one or more input signals 125, for example to test signals from a device under test (DUT) 121. DUT 121 may be any signal source configured to communicate via electrical and/or optical signals. For example, DUT 121 may comprise any form of transmitter or a signal transmission medium coupled via one or more signal probes. DUT 121 may communicate a large amount of complex data rendering manual swapping for testing purposes substantially impossible.

The oscilloscope 100 is a test and measurement instrument configured to receive and display the input signals 125 and corresponding counted events on a display 125 comprising one or more graticules. The oscilloscope 100 comprises ports 105 for receiving the input signals 125 and forwarding the input signals to local hardware for preconditioning, sampling, etc. The oscilloscope 100 also comprises controls 103 for receiving user input, for example alternating current (AC) or direct current (DC) coupling controls, trigger level controls, trigger-level hysteresis controls to alter trigger-level hysteresis thresholds and margins, etc. By employing the controls 103, a user can test input signals 125 from the DUT 121 causing the input signals 125 to be sampled, counted, and displayed on the graticules of the display 125. It should be noted that oscilloscope 100 is presented as an example for purposes of clarity of discussion, but should not be considered limiting as multiple types of oscilloscopes and multiple test setups may be employed without departing from the present disclosure.

Figure 2:
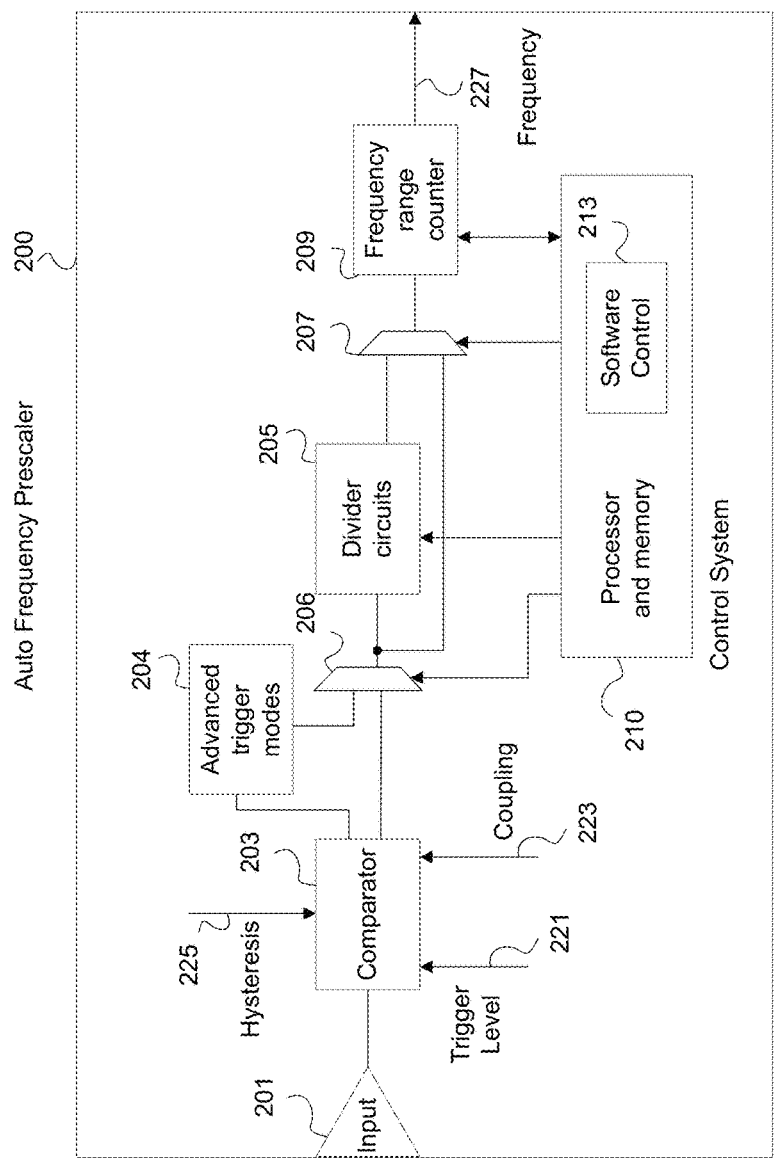
FIG. 2 is a block diagram of an embodiment of an auto frequency prescaler for use in an oscilloscope.

FIG. 2 is a block diagram of an embodiment of an auto frequency prescaler 200 for use in an oscilloscope, such as oscilloscope 100. Auto frequency prescaler 200 comprises an input 201 amplifier, a comparator 203, advanced trigger modes 204, divider circuits 205, switch 206-207, a frequency range counter 209, sampling hardware 215, a control system 210 comprising a processor and memory, and software control 213. Such components receive an input signal via input 201, condition the signal based on trigger-level hysteresis 225, trigger level 221, and coupling 223 as instructed by the user via controls (e.g. controls 103), create an event signal from the input signal, divide the frequency of the event signal by an optimal divide ratio, and count the events of the event signal for display on a display graticule (e.g. display 101).

Input 201 may be an amplifier and/or any other component to precondition an input signal (e.g. input signal 125) for sampling/analysis by later stage components. For example, the input 201 increases the gain of the input signal so that later components can more clearly distinguish signal changes, triggers, etc. It should be noted that input 201 may be the result of a differential input, in which case a pair of complementary signals are received via two inputs and combined resulting in input 201 receiving the difference between the two complementary signals.

Comparator 203 is any circuitry capable of comparing an input signal voltage with a corresponding voltage from another source and forwarding a result of the comparison (e.g. a triggered event). Comparator 203 receives a trigger level 221, coupling 223, trigger-level hysteresis 225 based on user controls. The trigger level 221 voltage, as set by a user, preconfigured in memory, and/or set by a processor, is compared to the input signal voltage to determine when a trigger event, such as an A or B event, has occurred. For example, comparator 203 may employ the trigger level 221 to determine when an A event or an Nth B event has occurred, and consequently when a signal capture should begin or end. Coupling 223 is a user input. Coupling 223 may be set to DC coupling to capture a signal as it is received by including both AC and DC components. Coupling 223 may also be set to AC to remove the DC portion of a signal and capture only the AC portion. As such, the comparator 203 may retain or selectively remove the DC component of the input signal based on coupling 223 as received from the user. Trigger-level hysteresis 225 input supports removing signal noise to eliminate improper triggers. For example, a signal value (e.g. voltage) causing a triggered event can be fed back into the comparator 203 via trigger-level hysteresis. The comparator 203 can then compare the signal value that triggered the event with a later signal value. If the later signal value does not increase/decrease by more than a margin (e.g. 2.5 percent), then the change in signal value is considered to be the result of signal noise and no second triggered event is recorded. The comparator 203 employs the various inputs to test the signal and outputs the results of the comparison as an event signal to downstream components.

Advanced trigger modes 204 are an optional group of circuits configured to capture more advanced triggers and output the occurrence of such an event. Specifically, A and B events are any events that a user wishes to capture and count. A and B events may be the same type of event, or may be selected as separate types of events (e.g. an A event of a first rising edge and a B event of a first detected error). For example, a user testing for errors coming from a DUT may wish to know of erroneous signals events (e.g. A or B events) being transmitted. Example erroneous signals include runt pulses (a non-zero signal rise not reaching a valid high/low level), glitches (a pulse with an amplitude or temporal/spectral width outside of an expected range), and/or a signal occurring at an unexpected frequency. Advanced trigger modes 204 are configured to test an input signal for events other than rising and falling edges, such as runts, glitches, etc., by triggering upon detecting specified signal shapes/frequencies and/or detecting any signal shape/frequency not conforming to a specified/expected pattern, and then output the results of such triggers as an event signal. Advanced trigger modes 204 may be controlled by the control system 210 via additional traces, which are not shown for reasons of overall figure clarity. It should be noted that the event signal of comparator 203 and/or advanced trigger modes 204 includes all events triggered by the input signal. Accordingly, the event signal may or may not have the same frequency as the input signal.

Switch 206 is any switch configured to output fewer than all inputs based on one or more control lines. Switch 206 is coupled to the outputs of the comparator 203 and the advanced trigger modes 204. Switch 206 can select the output of comparator 203 or any of the trigger modes from advanced trigger modes 204 based on input from the control system 210, allowing a variety of trigger events to be captured as A and/or B events.

Divider circuits 205 are any group of frequency divider circuits capable of dividing a frequency of a signal by one of a plurality of divide ratios. Each of the divider circuits 205, which are sometimes referred to prescalers, can be implemented as analog or digital dividers, such as regenerative frequency dividers employing feedback signals, flip flop based circuits, shift register based circuits, etc. Divider circuits 205 may be implemented as a chain, each of which is capable of division. For example, each divider circuit can be configured to perform a power of two division on a frequency of a signal received from a previous divider circuit. As such, a signal traversing more of the divider circuits 205 receives greater frequency division than a signal a signal traversing fewer of the divider circuits. When a power of two division is employed, the frequency divider circuits 205 can provide frequency division by divide ratios of 2, 4, 8, 16, 32, 64, 128, 256, etc. A signal is routed around the divider circuits 205 to achieve a divide ratio of one, representing no frequency division. While a power of two division is discussed, it should be noted that any desired divide ratio sequence can be achieved by employing the appropriate circuitry. It should also be noted that a signal traversing all of the divider circuits 205 would receive the highest divide ratio (e.g. 256), but would also result in the lowest resolution and the greatest amount of jitter/noise resulting from traversing all of the divider circuits 205. As such, an optimal divide ratio for each event signal can be selected by the control system 210 according to the signals frequency as discussed below. Once selected, the signal can traverse only the number of divider circuits 205 needed to achieve the optimal divide ratio and then be output to switch 207.

Switch 207 is any switch configured to output fewer than all inputs based on one or more control lines. Switch 207 is coupled to each output of the divider circuits 205 according to divide ratio and is also directly coupled to the comparator 203 via switch 206. Switch 207 can select the output of any of the received divide ratios based on input from the control system 210.

Frequency range counter 209 is any component configured to measure a frequency of an event signal by counting oscillations of the signal. Frequency range counter 209 receives the output of switch 207 indicating the occurrence of an event at comparator 203 or advanced trigger modes 204. Depending on the current configuration of switch 207, frequency range counter 209 can count the oscillations, and therefore frequency, of the events triggered by the input signal as subjected to a divide ratio by divider circuits 205. The output of frequency range counter 209 is the frequency 227 of the events as counted. As such, frequency 227 may be forwarded from the frequency range counter 209 for display on a screen such as a graticule of display 101.

Control system 210 is any control circuit capable of performing the methods disclosed herein. For example, control system 210 could be implemented as an application specific integrated circuit (ASIC), a digital signal processor (DSP), or other processing circuitry. In some embodiments, control system 210 comprises a processor a general purpose processor configured to execute instructions from memory and perform any methods and/or associated steps indicated by instructions stored thereon. The memory may be implemented as processor cache, random access memory (RAM), read only memory (ROM), solid state memory, hard disk drive(s), or any other memory type. The memory in the control system 210 acts as a non-transitory medium for storing computer program products and other instructions and providing such products/instruction to the processor for computation as needed. Control system 210 may comprise software control 213 which may be a firmware or software module configured to perform the method steps discussed herein (e.g. as instructions stored on memory and executed by the processor). Software control 210 could also be implemented in hardware in some embodiments. Control system 210 controls the comparator 203, advanced trigger modes 204, divider circuits 205, switches 206-207, and frequency range counter 209 based on input from the frequency range counter 209. The control system 210 may also receive input directly from the user via controls (e.g. controls 103). In some embodiments, the control system 210 may also supply trigger level 221, coupling 223, and trigger-level hysteresis 225 to the comparator 203 and/or advanced trigger modes 204 in response to changes to oscilloscope controls (e.g. controls 103). The control system 210 employs the divider circuits 205 and the frequency range counter 209 to iteratively test the event signal to determine the event frequency and hence determine an optimal divide ratio for the event signal as discussed below. The control system 210 also switches to a different divider circuit 205 configuration as needed to accommodate an event signal with a widely varying frequency. Accordingly, control system 210 allows a signal to be received from a single input while accommodating the full range of frequencies via the divider circuits.

Figure 3:
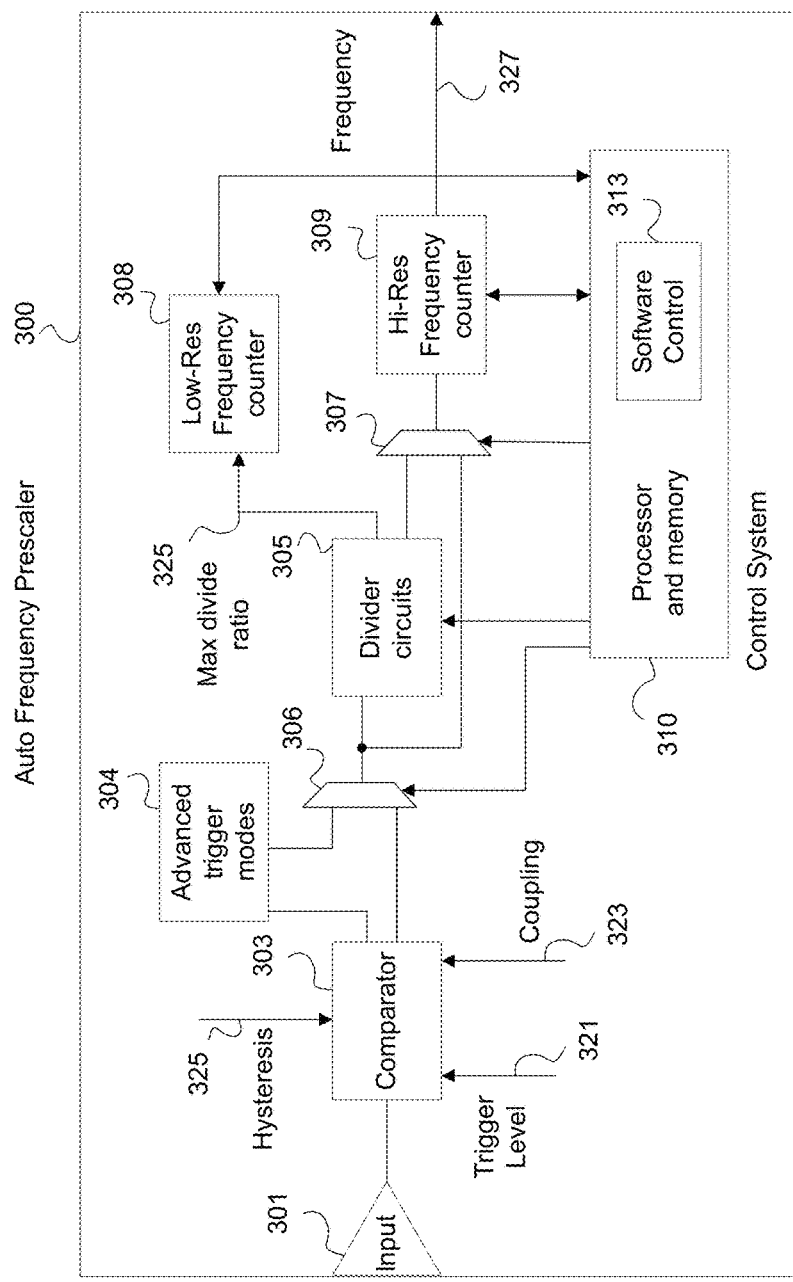
FIG. 3 is a block diagram of an embodiment of another auto frequency prescaler configured to respond to non-incremental signal frequency changes.

FIG. 3 is a block diagram of an embodiment of another auto frequency prescaler 300 configured to respond to non-incremental input/event signal frequency changes. Auto frequency prescaler 300 is employed in an oscilloscope, such as oscilloscope 100. Auto frequency prescaler 300 is substantially similar to auto frequency prescaler 200, but comprises additional functionality. Auto frequency prescaler 300 comprises an input 301, a comparator 303, advanced trigger modes 304, divider circuits 305, switches 306-307, a control system 310, a software control 313 module, and a high resolution (Hi-Res) frequency counter 309, which are substantially similar to input 201, comparator 203, advanced trigger modes 204, divider circuits 205, switches 206-207, control system 210, software control 213, and frequency range counter 209, respectively. Comparator 303 receives trigger level 321 signals, trigger-level hysteresis 325 signals, and coupling 323 signals that are substantially similar to trigger level 221, trigger-level hysteresis 225, and coupling 223. Further, Hi-Res frequency counter's 309 signal frequency 327 signal is substantially similar to frequency range counter's 209 frequency 227 signal.

During a sudden drastic change in event signal frequency, for example a change by an order of magnitude in less than five nanoseconds, a prescaler 200 may temporarily fail to distinguish the change. Such a sudden drastic change is sometimes referred to herein as a non-incremental change. As a specific example, the prescaler 200 may be looking for a small change on the order MHz based on a first signal period and fail to note a change on the order tens of Gigahertz (GHz) at the start of a second signal period. Prescaler 300 comprises a low resolution (Low-Res) frequency counter 308 to overcome this concern. Low-Res frequency counter 308 is similar to Hi-Res frequency counter 309. However, Low-Res frequency counter 308 always receives the maximum divide ratio 325 signal from the divider circuits 305, where the maximum divide ratio 325 signal is the result of the largest divide ratio that can be applied to the signal by the divider circuits 305. For example, if the divider circuits 305 are capable of dividing up to a ratio of 256, then the max divide ratio is 256. Accordingly, Low-Res frequency counter 308 always receives the lowest resolution view of the event signal available. Low-Res frequency counter 308 counts the changes occurring at low resolution, and hence is aware of large scale changes to the signal. The output of the Low-Res frequency counter 308 is forwarded to control system 310 as control data. The control system 310 can employ the output of the Low-Res frequency counter 308 to determine when to stop attempting to make fine adjustments to estimate the frequency of the first signal period and begin making coarse adjustments to converge at an estimate of a new frequency associated with the second signal period. It should be noted that the lowest resolution version of the signal is also the fastest changing version. Accordingly, the Low-Res frequency counter 308 can count events occurring on the order of microseconds to milliseconds, while the Hi-Res frequency counter 309 can count events on the order of microseconds to seconds depending on control settings.

Figure 4A:
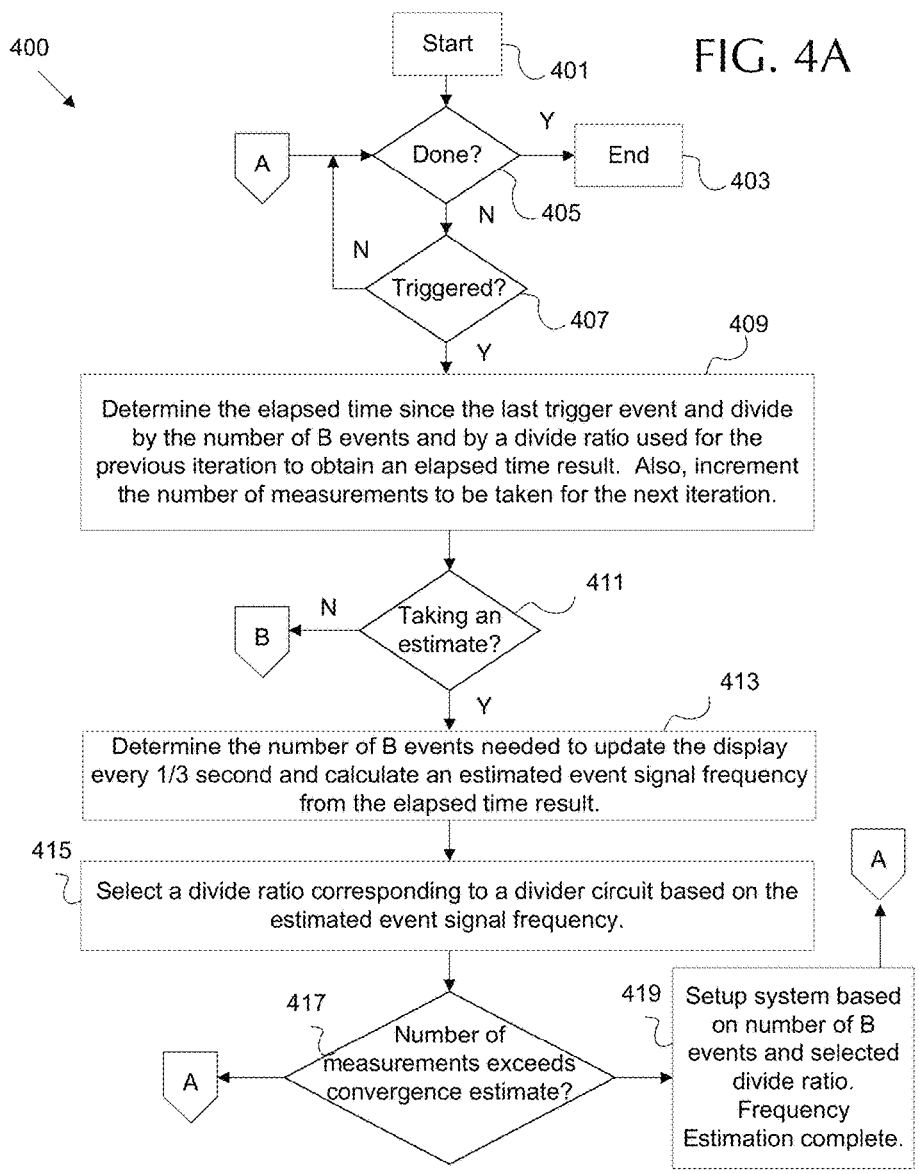
FIGS. 4A-4B are flowcharts of an embodiment of a method of automatically prescaling a signal based on an estimated event signal frequency.
Figure 4B:
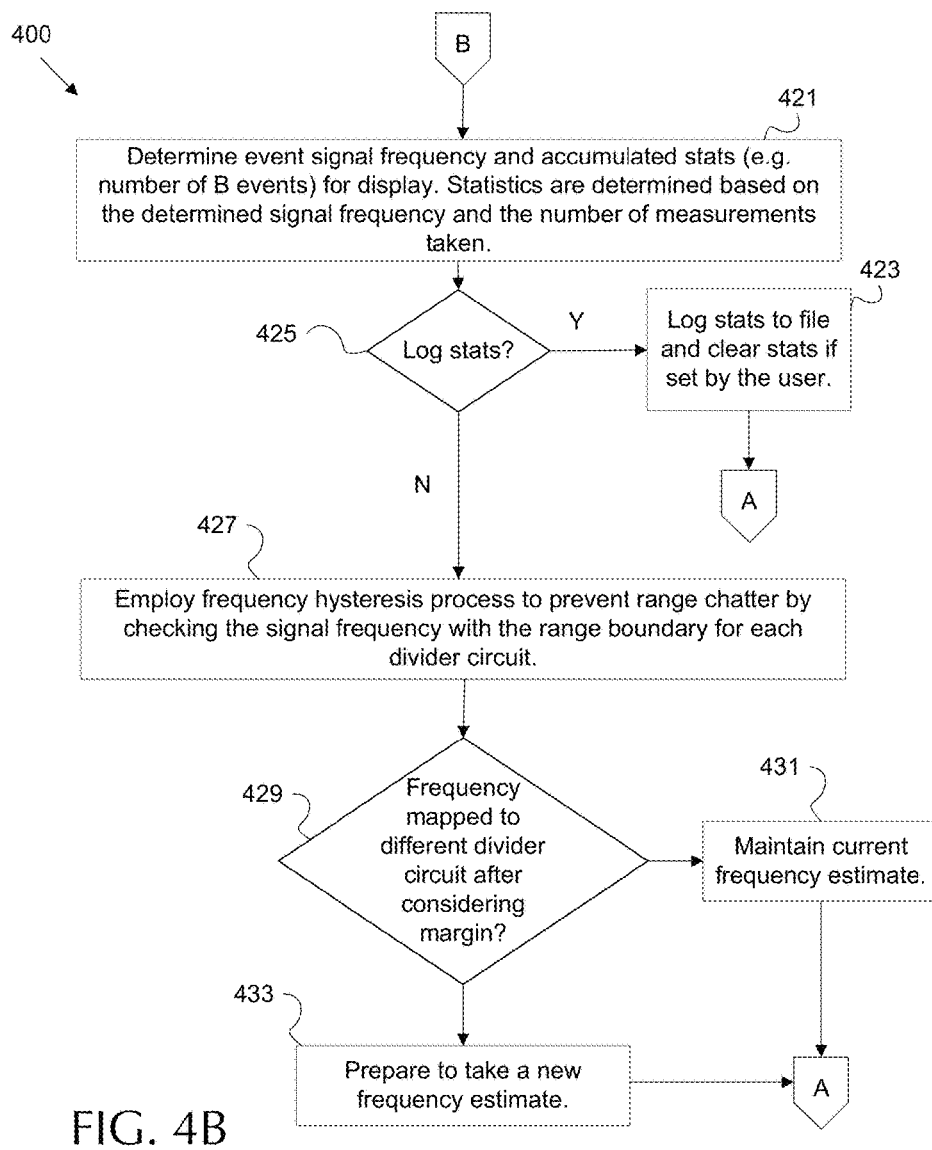

FIGS. 4A-4B are flowcharts of an embodiment of a method 400 of automatically prescaling an event signal based on an estimated event signal frequency, for example by employing an oscilloscope 100 with an auto frequency prescaler 200 or 300. The method 400 starts at block 401, for example when an input signal is inserted into an oscilloscope port. Method 400 employs iterative loops, so the oscilloscope determines whether the method is complete at block 405. In other words, the oscilloscope determines whether the tasks employed in the loop, as discussed below, have been completed. If so, the method 400 proceeds to the end block 403. If not, the method 400 proceeds to block 407 and determines whether a signal edge or other advanced trigger of an input signal has triggered the comparator/advance trigger modes, indicating that an A event or a B event has occurred. If no trigger has occurred, the method 400 returns to block 405 until a trigger occurs. Once a trigger occurs, the method 400 proceeds to block 409.

At block 409, an elapsed time since the last trigger event is determined. For example, the elapsed time may be determined by an application specific integrated circuit (ASIC), such as an HFD118 SBTL ASIC comprising a 54-bit delta counter with a 200 femtosecond (fs) resolution. The elapsed time is then divided by the number of B events used in the previous iteration. The number of B events used may be equal to the number of B events needed to update the display every ⅓ second. The elapsed time is also divided by the hardware divisor/divide ratio employed in the previous iteration. The result of the elapsed time as divided by the number of B events and hardware divisor is saved as an elapsed time result. Further, the number of measurements taken during the last iteration is incremented toward a convergence value so that one more measurement is taken by the oscilloscope during this iteration than last iteration. Incrementing the number of measurements value allows the method 400 to determine when a frequency estimate of the event signal has converged with an actual frequency, as discussed below.

At block 411, the method 400 determines whether the system is currently taking a frequency estimate. If the estimate has already converged with a frequency value, then the method 400 proceeds to step 421. If the method 400 is currently taking a frequency estimate, then the method 400 proceeds to step 413. At step 413, the number of B events needed to update the display every ⅓ second without missing any B events is determined (e.g. the optimum display trigger event count) based on the current hardware divisor being employed and the elapsed time result determined at step 409. Further, an estimated signal frequency is determined from the elapsed time result. The estimated signal frequency is equal to 1/elapsed time result. It should be noted that the optimum display trigger event count to achieve a frequency update of a predetermined number of times per second (e.g. three times per second) can be expressed mathematically as:

$$\text{optimum display trigger event count}=(\text{frequency}/3)/(\text{divide ratio}) \quad \text{Equation 1}$$

For example, the optimum displayed trigger event count is selected so that 13 digits of precision can be obtained every second. It should also be noted that the user may override the calculated optimum display trigger event count to obtain greater precision at the cost of slower display refresh rate. For example, the number of digits of precision may increase/decrease for each decade of increase/decrease in the number of B event triggering events counted.

At block 415, a divide ratio corresponding to a divider circuit is selected based on the estimated frequency of the event signal from block 413. For example, a divide ratio of 1 is selected if the estimated frequency is less than $1.25\ e^9$, 2 for less than $2.50\ e^9$, 4 for less than $5.0\ e^9$, 8 for less than $10.0\ e^9$, 16 for less than $20.00\ e^9$, or 32 for any other estimated frequency. Once a divide ratio is selected, the method 400 proceeds to block 417 and determines whether the incremented number of measurements of step 409 exceeds a predetermined convergence estimate (e.g. set to four). If not, method 400 returns to block 405 and goes through another iteration. If so, the estimated frequency is the actual event signal frequency, so method 400 proceeds to block 419. At block 419, the oscilloscope system is setup based on the number of B events calculated at block 413 and the divide ratio selected at block 415. Further, the frequency estimation is complete at block 419. The method 400 then returns to step 405. However, if the method 400 has traversed block 419, the method 400 moves out of the frequency estimation loop at block 411 and proceeds to block 421. This is tracked in part by setting the number of measurements to zero for future frequency estimation and setting a value associated with taking an estimate to false.

Figure 6:
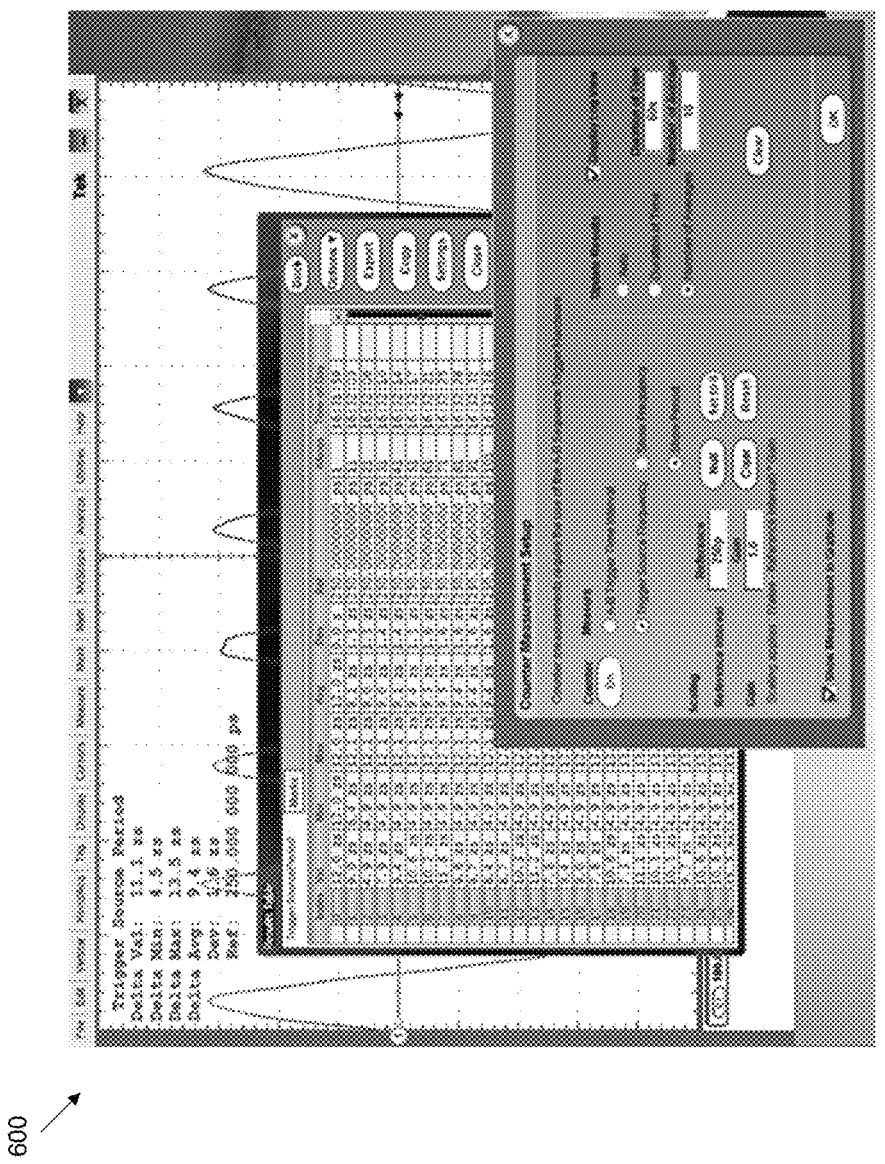
FIG. 6 illustrates an embodiment of a user interface for an oscilloscope employing an auto frequency prescaler.

At block 421, the actual signal frequency is determined based on the estimations in the previous blocks. Further, the accumulated statistics, such as the number of B events that have been triggered, are accumulated for display. The statistics may include signal minimum value, maximum value, average and standard deviation. The statistics are determined based on the determined event signal frequency and the number of measurements taken. The method 400, then proceeds block 425 to determine whether the user has requested the statistics be logged or displayed. If the statistics are to be logged, the method 400 proceeds to block 423 to log the statistics to a results table file as shown in FIG. 6. Also, the statistics may be cleared from the display/log after the log is taken based on user input. The method, 400 then returns to step 405 to determine whether to end 403 or take more measurements.

If logging is not needed the method 400 continues to block 427. At block 427, a frequency hysteresis process is employed to prevent chatter. In this case, chatter occurs when an event signal frequency is close to a lower or upper boundary associated with a particular divide ratio and corresponding divider circuit. If the event signal repeatedly traversed the boundary, for example due to noise, the oscilloscope could repeatedly re-select divider circuits for the signal resulting in chatter. To prevent the chatter, the frequency hysteresis process requires the frequency to go above or below the corresponding boundary by more than a margin (e.g., + or −25 MHz) before a new divide ratio is selected.

At block 429, the method 400 determines whether the event signal frequency should be mapped to a different divider circuit/divide ratio after considering the margin. For example, an array of boundaries may be employed with an upper and/or lower boundary for each divider circuit. The calculated signal frequency plus the margin can be checked against each boundary in the array to determine whether the event signal frequency should be mapped to a different divider circuit. If so, the method 400 proceeds to block 433 and prepares to take a new frequency estimate. Proceeding to block 433 indicates a true signal change has occurred, so a new system setup may be required. In such a case, the value associated with taking an estimate is set to true and the estimation process is started. For example, the divider ratio is reset to a maximum divide ratio for iterating back to a true frequency value, a number of B events and number of measurements to be taken are reset to initial values (e.g. zero), etc.

If the event signal frequency does not traverse the boundary by more than the margin, any traversal is considered noise, so the current frequency estimate is maintained at block 431. The method 400 then returns to step 405 to either take a new frequency estimate or continue analyzing the signal without changing divider circuits, respectively. By employing method 400, in conjunction with an auto frequency prescaler, the oscilloscope can continuously determine the frequency of an event signal and automatically select a divider circuit with an optimal divide ratio for the event signal based on the determined frequency. Accordingly, a single input can be automatically and dynamically configured to accept any frequency regardless of the limitations of the associated sampling hardware. In an embodiment, method 400 may be implemented by employing software code. It should also be noted that the frequency hysteresis process of blocks 427, 429, 431, and 433 may not depend on the results of block 425. For example, the frequency hysteresis process of blocks 427, 429, 431, and 433 may occur during step 421 and may be employed to select a different divider circuit if such is needed while statistics on the event signal/input signal are being accumulated.

Figure 5:
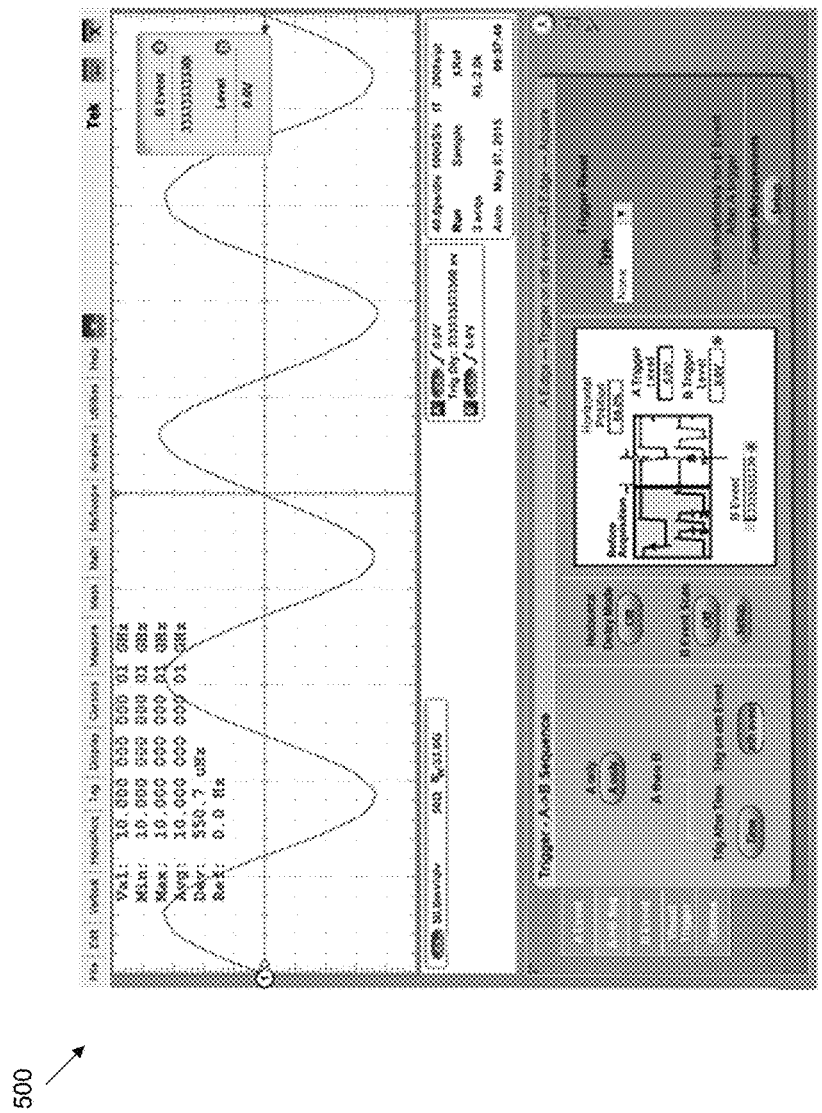
FIG. 5 illustrates an embodiment of an oscilloscope graticule displaying an auto frequency prescaled signal with a precision of 1 part per billion.

FIG. 5 illustrates an embodiment of an oscilloscope graticule 500, such as on an oscilloscope 100 employing an auto frequency prescaler 200 or 300 according to method 400, displaying an auto frequency prescaled signal with a precision of 1 part per trillion. The graticule 500 and corresponding user interface depict a signal captured according to an A trigger event and an Nth B trigger event. As shown on graticule 500 a single input is employed to capture a signal, regardless of frequency, and still maintain an extremely high level of precision. In the case shown, the signal is measured at 10.00000000001 GHz.

FIG. 6 illustrates an embodiment of a user interface 600 for an oscilloscope, such as oscilloscope 100, employing an auto frequency prescaler, such as auto frequency prescaler 200 or 300, according to method 400. A user may employ user interface 600 in conjunction with oscilloscope controls to manage an oscilloscope control system. As shown, the oscilloscope can determine the source frequency of the event signal, set triggers accordingly, and display the results on the graticule and/or on a corresponding table/log as shown in FIG. 6. As shown above, both higher band and lower band frequencies can be captured and displayed employing a single input by employing the frequency measurement techniques and divider circuit controls as disclosed herein.

Embodiments of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
   an input port configured to receive an input signal;
   a comparator configured to determine whether an event has occurred in an input signal and generate an event signal when the event occurs in the input signal;
   one or more divider circuits employing a plurality of divide ratios such that each divide ratio scales the event signal indicating events in the input signal by a predetermined integer value;
   a control system configured to:
      iteratively determine an estimated signal frequency of the event signal, and
      automatically select a divide ratio for the event signal based on the estimated signal frequency; and
   a frequency range counter configured to determine a number of trigger events in the event signal and output a frequency of the event signal based on the determined number of trigger events,
   wherein the frequency range counter is further configured to forward the count to the control system, wherein the control system is further configured to determine an elapsed time result based on the counted number of trigger events, and wherein the control system determines the estimated signal frequency based on the determined elapsed time result.

2. The test and measurement instrument of claim 1, further comprising a low resolution frequency counter in addition to the frequency range counter, the low resolution frequency counter continuously receiving the event signal scaled by a maximum divide ratio and forwarding a resulting low resolution count to the control system to detect non-incremental frequency changes in the event signal.

3. The test and measurement instrument of claim 1, wherein the control system is further configured to:
   determine an optimum display trigger event count resulting in a predetermined number of frequency measurements per second, and
   employ the selected divide ratio and optimum display trigger event count to display the event signal.

4. The test and measurement instrument of claim 1, wherein iteratively determining the estimated signal frequency of the event signal includes incrementally increasing a number of frequency measurements taken over each iteration until the number of frequency measurements exceeds a predetermined convergence estimate.

5. The test and measurement instrument of claim 1, wherein selecting the divide ratio includes employing a frequency hysteresis process requiring the estimated signal frequency to vary from a range associated with a first divisor plus a margin before selecting a second divisor to prevent frequency range chatter.

6. A method implemented in a test and measurement instrument, the method comprising:
   receiving an input signal via an input;
   generating an event signal when an event occurs in the input signal;
   iteratively determining an estimated signal frequency of an event signal indicating events in the input signal;
   automatically selecting a divide ratio, corresponding to a divider circuit, for the event signal based on the estimated signal frequency such that the selected divide ratio scales the event signal by a predetermined integer value for signal processing by the test and measurement instrument;
   determining a number of trigger events in the event signal and outputting a frequency of the event signal based on the determined number of the trigger events;
   determining an elapsed time result based on the number of trigger events; and
   employing the elapsed time result to determine the estimated signal frequency.

7. The method of claim 6, wherein the divide ratio is selected based on a low resolution counter continuously receiving the event signal scaled by a maximum divide ratio to detect non-incremental frequency changes in the event signal.

8. The method of claim 6, further comprising:
determining an optimum display trigger event count resulting in a predetermined number of frequency measurements per second, and
employing the selected divide ratio and optimum display trigger count to display the event signal on a test and measurement instrument screen.

9. The method of claim 6, wherein iteratively determining the estimated signal frequency of the event signal includes incrementally increasing a number of frequency measurements taken over each iteration until the number of frequency measurements exceeds a predetermined convergence estimate.

10. The method of claim 6, wherein selecting the divide ratio includes employing a frequency hysteresis process requiring the estimated signal frequency to vary from a range associated with a first divisor plus a margin before selecting a second divisor to prevent frequency range chatter.

11. A non-transitory computer readable medium having stored thereon a computer program product for execution by a processor configured to perform test and measurement, the computer program causing the processor to perform a method comprising:
receiving an input signal via an input;
generating an event signal when an event occurs in the input signal;
iteratively determining an estimated signal frequency of an event signal indicating events in the input signal;
automatically selecting a divide ratio, corresponding to a divider circuit, for the event signal based on the estimated signal frequency such that the selected divide ratio scales the event signal by a predetermined integer value for signal processing by the test and measurement instrument; and
determining a number of trigger events in the event signal and outputting a frequency of the event signal based on the determined number of the trigger events;
determining an elapsed time result based on the number of trigger events; and
employing the elapsed time result to determine the estimated signal frequency.

12. The computer readable medium of claim 11, wherein the method performed further comprises:
determining an optimum display trigger event count resulting in a predetermined number of measurements per second, and
employing the selected divide ratio and optimum display trigger count to display the event signal on a test and measurement instrument screen.

13. The computer readable medium of claim 11, wherein selecting the divide ratio includes employing a frequency hysteresis process requiring the estimated signal frequency to vary from a range associated with a first divisor plus a margin before selecting a second divisor to prevent frequency range chatter.

* * * * *